(12) United States Patent
Botnar et al.

(10) Patent No.: US 11,543,478 B2
(45) Date of Patent: Jan. 3, 2023

(54) METHOD AND APPARATUS FOR GENERATING A T1/T2 MAP

(71) Applicants: Siemens Healthcare Limited, Camberley (GB); King's College London, London (GB)

(72) Inventors: Rene Botnar, London (GB); Radhouene Neji, Camberley (GB); Claudia Prieto, London (GB); Giorgia Milotta, London (GB)

(73) Assignees: Siemens Healthcare Limited, Camberley (GB); King's College, London, London (GB)

( * ) Notice: Subject to any disclaimer, the term of this patent is extended or adjusted under 35 U.S.C. 154(b) by 198 days.

(21) Appl. No.: 16/783,531

(22) Filed: Feb. 6, 2020

(65) Prior Publication Data
US 2020/0249299 A1 Aug. 6, 2020

(30) Foreign Application Priority Data
Feb. 6, 2019 (GB) ..................... 1901625

(51) Int. Cl.
*G01R 33/50* (2006.01)
*G01R 33/48* (2006.01)
(Continued)

(52) U.S. Cl.
CPC ......... *G01R 33/50* (2013.01); *G01R 33/4828* (2013.01); *G01R 33/5602* (2013.01);
(Continued)

(58) Field of Classification Search
CPC ............... G01R 33/50; G01R 33/4828; G01R 33/5602; G01R 33/567; G01R 33/4822;
(Continued)

(56) References Cited

U.S. PATENT DOCUMENTS

| | | |
|---|---|---|
| 2014/0292325 A1 | 10/2014 | Bieri |
| 2015/0301142 A1 | 10/2015 | Griswold et al. |
| 2019/0346522 A1* | 11/2019 | Botnar ............. G06T 11/006 |

OTHER PUBLICATIONS

Weigel M.; "Extended Phase Graphs: Dephasing, RF Pulses, and Echoes—Pure and Simple", Journal of Magnetic Resonance Imaging vol. 41; pp. 266-295; 2015.
(Continued)

*Primary Examiner* — Susan S Lee
(74) *Attorney, Agent, or Firm* — Banner & Witcoff Ltd.

(57) ABSTRACT

A method and apparatus for generating a T1 or T2 map for a three-dimensional (3D) image volume of a subject. The method includes acquiring first, second, and third 3D images of the image volume of the subject. Signal evolutions of voxels through the first to third 3D images by comparing voxel intensity levels of corresponding voxel locations in the first, second, and third 3D images. A simulation dictionary representing the signal evolutions for a number of different tissue parameter combinations is obtained. The T1 or T2 map is generated by comparing the determined signal evolutions to entries in the dictionary and by finding, for each of the determined signal evolutions, the entry in the dictionary that best matches the determined signal evolution.

15 Claims, 8 Drawing Sheets

(51) Int. Cl.
*G01R 33/56* (2006.01)
*G01R 33/567* (2006.01)
*G06T 7/00* (2017.01)

(52) U.S. Cl.
CPC .......... *G01R 33/567* (2013.01); *G06T 7/0012* (2013.01); *G06T 2207/10088* (2013.01); *G06T 2207/30048* (2013.01)

(58) Field of Classification Search
CPC ............ G01R 33/5607; G01R 33/5673; G01R 33/448; G06T 7/0012; G06T 2207/10088; G06T 2207/30048
See application file for complete search history.

(56) References Cited

OTHER PUBLICATIONS

Messroghli, et al., "Modified Look-Locker Inversion Recovery (MOLLI) for High-Resolutions T1 Mapping of the Heart", Magnetic Resonance in Medicine 52:141-146 (2004); 2004.

A. Bustin et al., "Five-minute whole-heart coronary MRA with sub-millimeter isotropic resolution, 100% respiratory scan efficiency, and 3D-PROST reconstruction," Magn. Reson. Med., vol. 0, No. 0, Jul. 2018.

C. Prieto et al., "Highly efficient respiratory motion compensated free-breathing coronary MRA using golden-step Cartesian acquisition," J. Magn. Reson. Imaging, vol. 41, No. 3, 2015.

M. Henningsson, P. Koken, C. Stehning, R. Razavi, C. Prieto, and R. M. Botnar, "Whole-heart coronary MR angiography with 2D self-navigated image reconstruction," Magn. Reson. Med., vol. 67, No. 2, 2012.

P. Montant, M. Sigovan, D. Revel, and P. Douek,—"MR imaging assessment of myocardial edema with T2 mapping," Diagn. Interv. Imaging, vol. 96, No. 9, 2015.

J. Liu, D. C. Peters, and M. Drangova, "Method of B0 mapping with magnitude-based correction for bipolar two-point Dixon cardiac MRI," *Magn. Reson. Med.*, vol. 78, No. 5, pp. 1862-1869, Dec. 2016.

\* cited by examiner

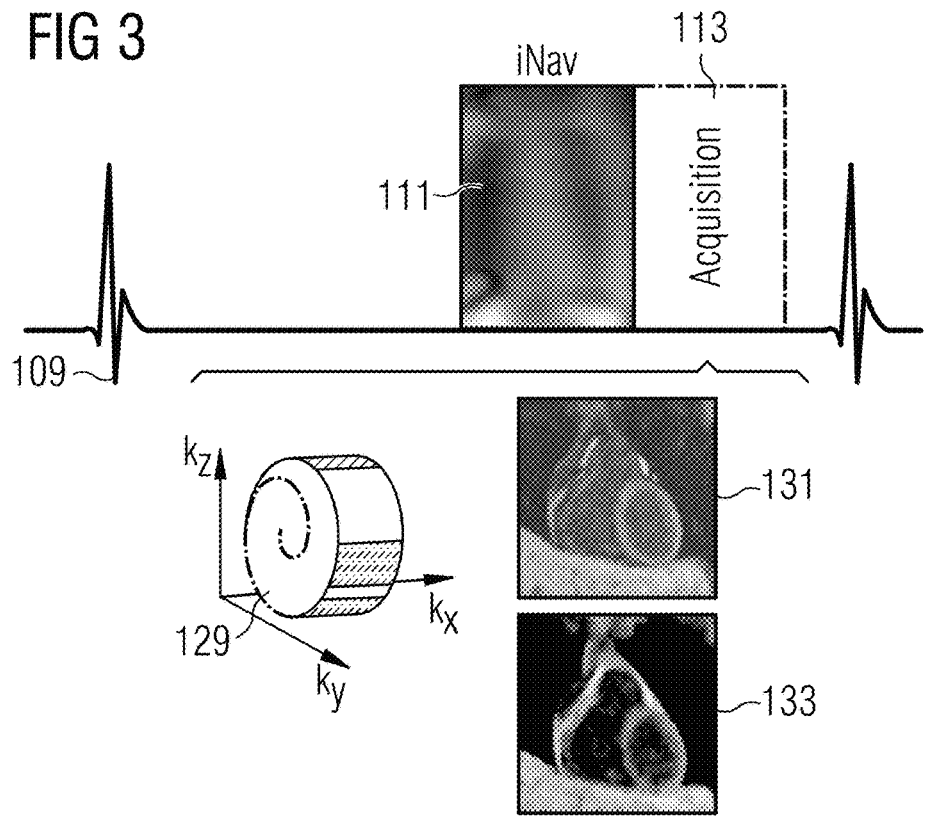
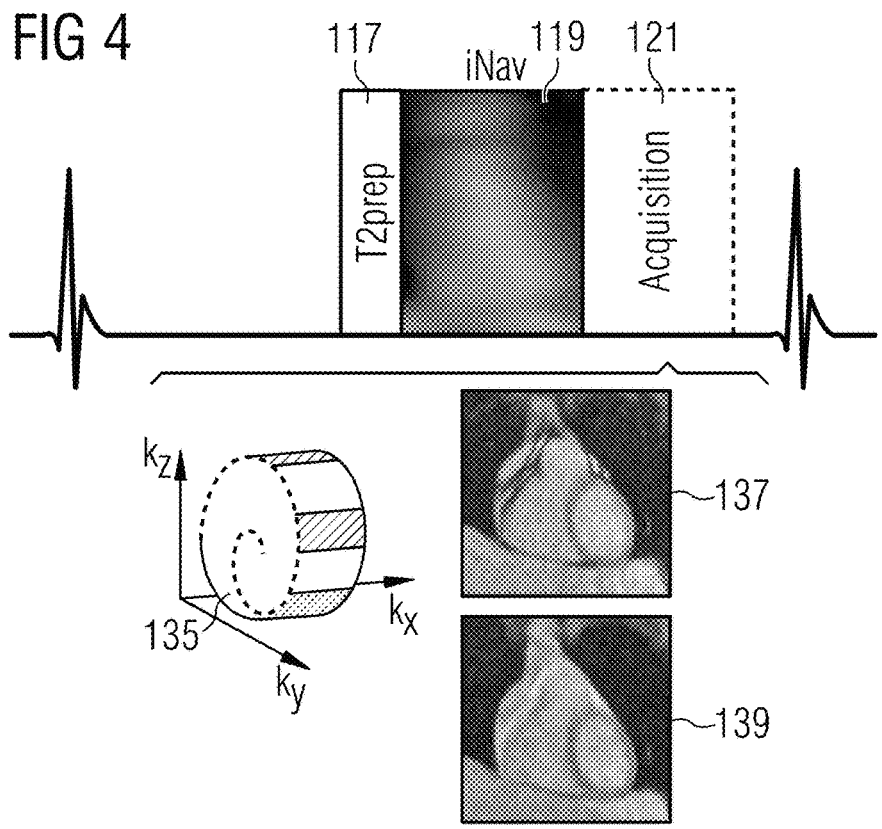

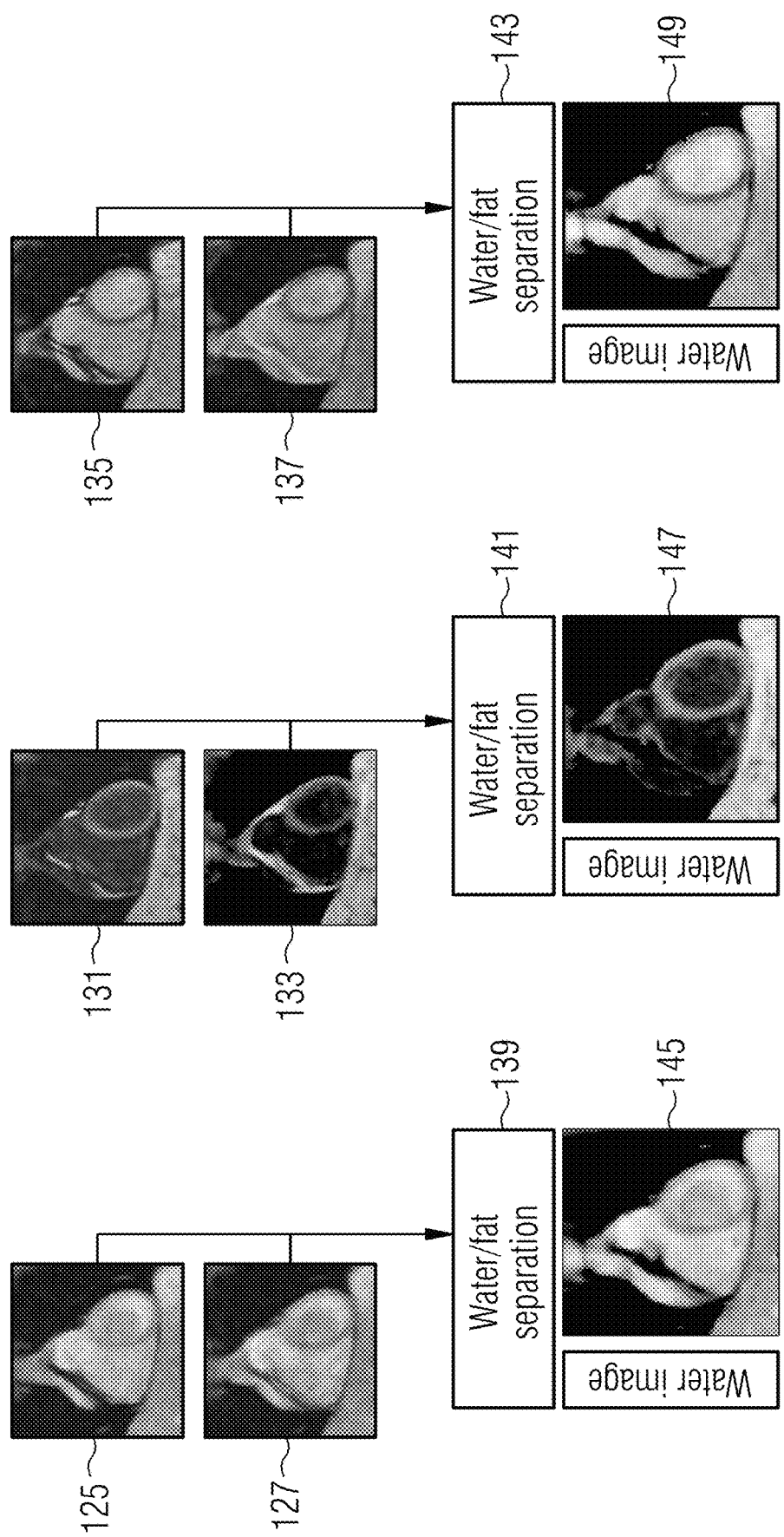

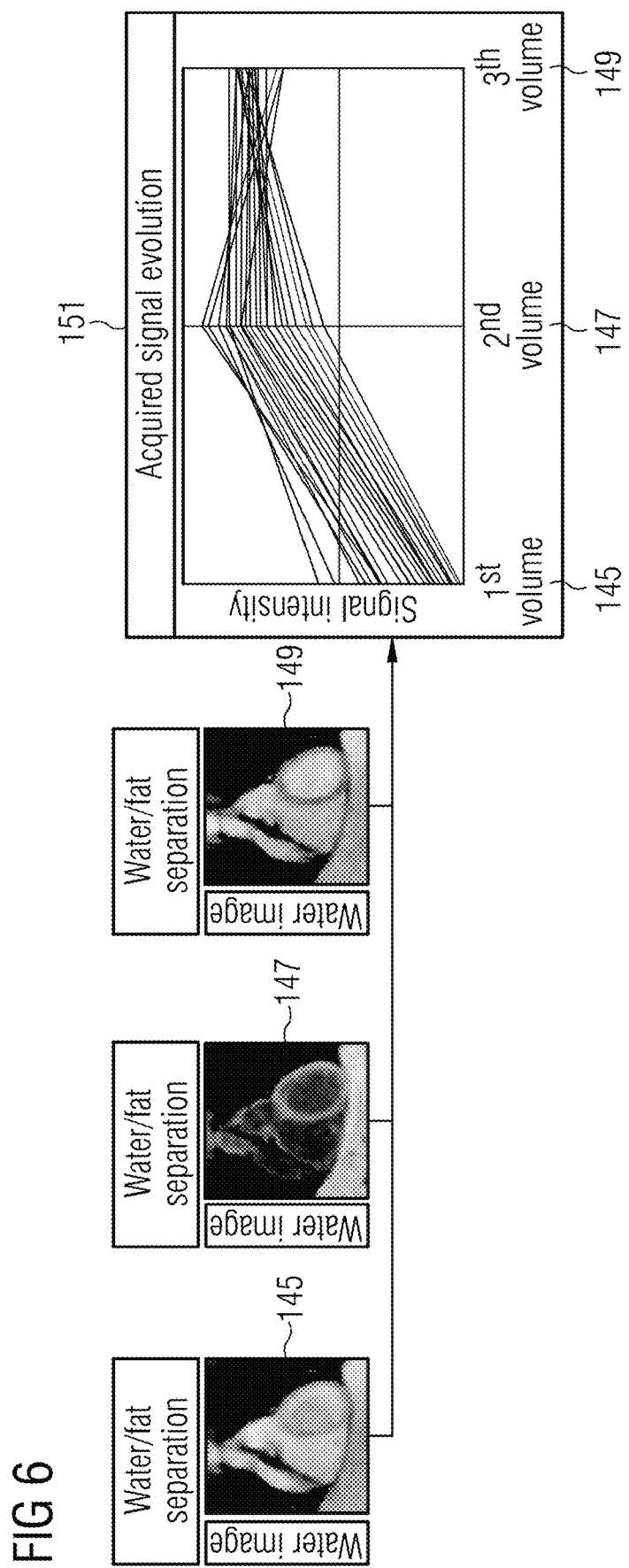

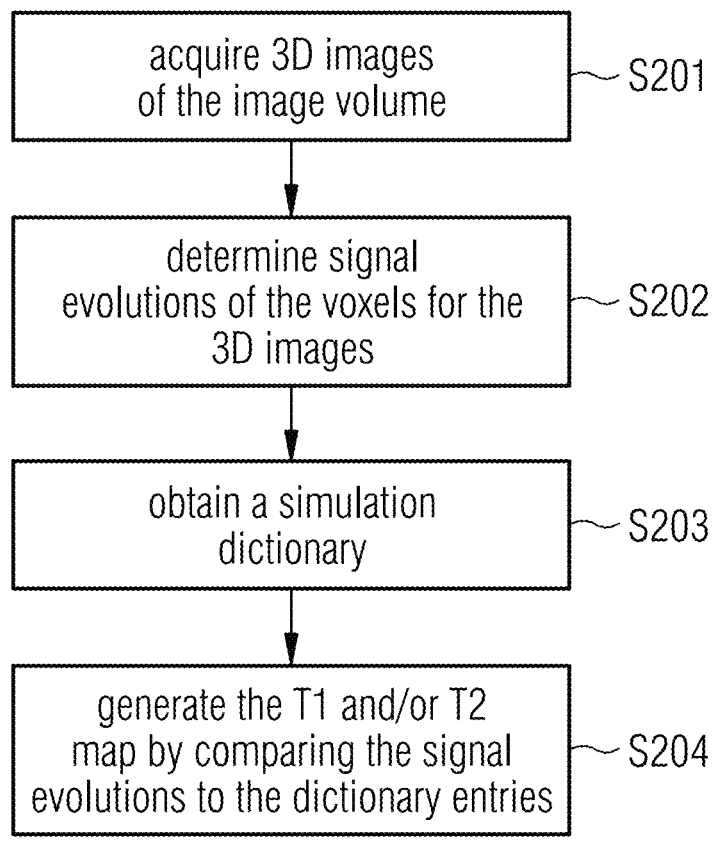

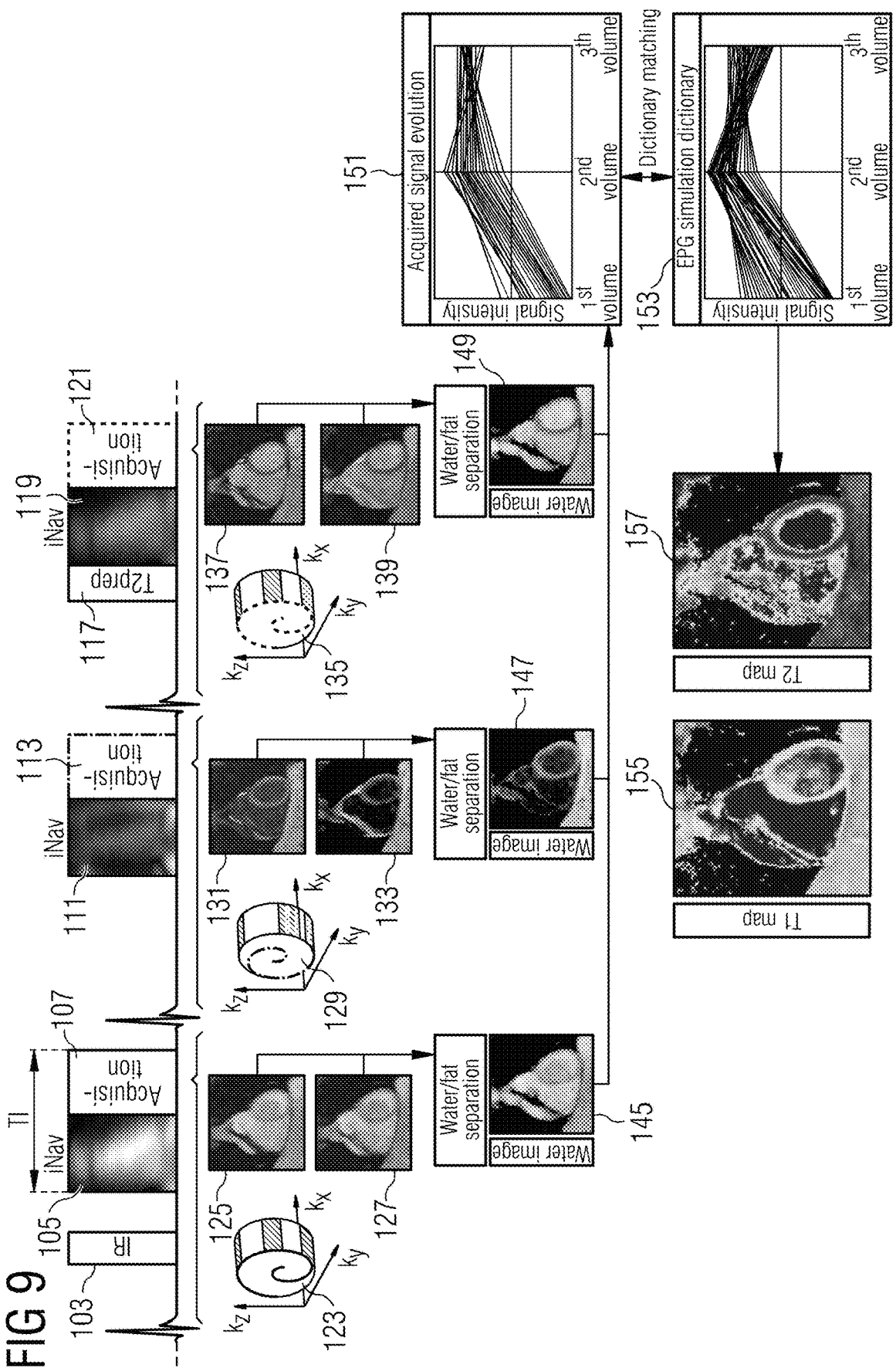

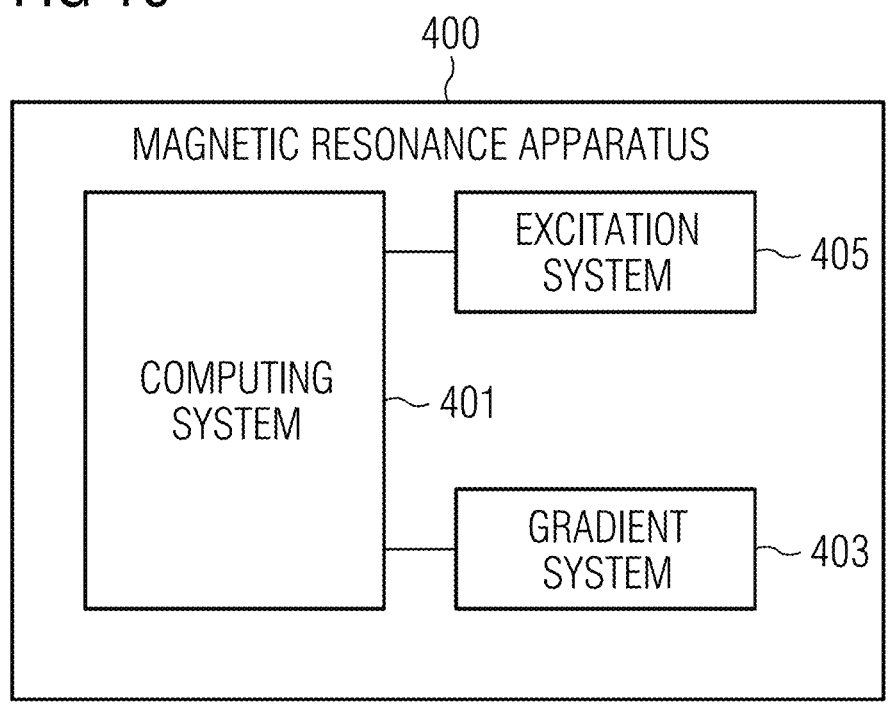

METHOD AND APPARATUS FOR GENERATING A T1/T2 MAP

TECHNICAL FIELD

The present disclosure is directed towards a method and apparatus for generating a T1 and/or a T2 map, and in particular is directed towards a method and apparatus for generating a T1 and/or T2 map using 3D MR acquisition sequences.

BACKGROUND

Tissue characterization plays an important role in the identification and quantification of diseased myocardial tissue and oedema. T1 and T2 maps are generated in existing approaches to aid in the assessment of tissue properties.

T1 relaxation time constant, also known as the spin-lattice or longitudinal relaxation time, is a measure of how fast the nuclear spin magnetization returns to its equilibrium state after an excitation pulse. T1 is a key source of soft tissue contrast in MRI. Estimating T1 times and using the T1 times to generate a T1 map of an examination area provides a useful tool for a medical professional to identify diseases, lesions and abnormalities in soft tissue that affect T1. T1 mapping is useful to characterize diffuse or infiltrative myocardial diseases, including cardiomyopathies, myocarditis, and amyloidosis.

T1 mapping, and in particular cardiac T1 mapping or myocardial T1 mapping, may be performed using specific MR pulse sequences.

One such MR pulse sequence is commonly known as the MOdified Look-Locker Inversion recovery (MOLLI) which may be used for myocardial T1 mapping. In an example MOLLI sequence, an inversion pulse is generated and followed by the acquisition of five images. The five images are acquired during the diastolic period of the cardiac cycle within five successive heartbeats. The diastolic period is the phase of the heartbeat when the myocardium relaxes to allow the chambers of the heart to fill with blood. After the acquisition of the five images, there is a rest period of three heartbeats, before the sequence is repeated for three heartbeats. The inversion pulse and the image acquisitions are electrocardiogram, ECG, triggered meaning that a cardiac event as measured by an ECG apparatus triggers the generation of the inversion pulse and the image acquisitions.

Here, an "inversion pulse" means a 180 degrees excitation pulse that acts to flip the initial longitudinal magnetization of a subject's tissue to point opposite to the direction of the main (e.g., static) magnetic field.

The resultant images may then be sorted in ascending order with respect to the time after the generation of the inversion pulse, the inversion time (TI), and the signal intensity in each pixel of the image may be fit onto an apparent T1 recovery curve during a T1 fitting process. The apparent T1 recovery curve may follow a three-parameter model $S(t)=A-B \exp(-t/T1^*)$ where $S(t)$ is the signal intensity at time t after application of the inversion pulse. A, B and $T1^*$ are the parameters to be estimated by the curve fitting. $T1^*$ is the apparent recovery time rather than the actual recovery time T1. T1 can be calculated by applying the correction $T1=T1^* \times ((B/A)-1)$. In some examples, the correction $T1=T1^* \times ((B/A)-1)/C$ may be applied where C is an inversion factor of the inversion pulse. After computing the T1 time for each pixel, a T1 map for the region of interest may be generated. This example existing T1 mapping approach is disclosed in: D. R. Messroghli, A. Radjenovic, S. Kozerke, D. M. Higgins, M. U. Sivananthan, and J. P. Ridgway, "Modified Look-Locker inversion recovery (MOLLI) for high-resolutionT1 mapping of the heart," *Magn. Reson. Med.*, vol. 52, no. 1, pp. 141-146, July 2004, the disclosures of which are hereby incorporated by reference.

The T2 time constant is also known as the spin-spin relaxation time constant. T2 values may also be estimated using known magnetic resonance imaging based techniques. An example, T2 mapping sequence comprises obtaining three 2D MR images using T2 preparation pulses with different time durations and with a long relaxation time after each acquisition sequence to allow for transverse relaxation to be completed. The three MR images are then used as the basis to construct a transverse relaxation curve and then to calculate the T2 value for each voxel. This example existing T2 mapping approach is disclosed in: P. Montant, M. Sigovan, D. Revel, and P. Douek, "MR imaging assessment of myocardial edema with T2 mapping," *Diagn. Interv. Imaging*, vol. 96, no. 9, 2015, the disclosures of which are hereby incorporated by reference.

In conventional T1 mapping and T2 mapping techniques, such as the approaches outlined above, only a single low-resolution 2D slice is acquired for each breath hold of the subject. An additional problem is that partial volume effects may occur at the water-fat interface in the imaged subject tissue, and these partial volume effects may affect the T1 and T2 quantification.

It is an object of the present disclosure to improve or at least provide alternatives to existing approaches for generating T1 and/or T2 maps.

SUMMARY

According to a first aspect of the disclosure, there is provided a method of generating a longitudinal magnetic relaxation time constant, T1, and/or transverse magnetic relaxation time constant, T2, map for a three-dimensional, 3D, image volume of a subject. The method comprises acquiring first, second, and third 3D images of the image volume of the subject, wherein each of the first, second, and third 3D images are acquired at a different time using a 3D MR acquisition sequence with different MR acquisition parameters. The method further comprises determining signal evolutions of the voxels through the first to third 3D images by comparing voxel intensity levels of corresponding voxel locations in the first, second, and third 3D images. The method further comprises obtaining a simulation dictionary representing the signal evolutions for a number of different tissue parameter combinations. The method further comprises generating the T1 and/or T2 map by comparing the determined signal evolutions to entries in the dictionary and by finding, for each of the determined signal evolutions, the entry in the dictionary that best matches the determined signal evolution.

Beneficially, the present disclosure does not generate the T1 and/or T2 map by acquiring 2D slices during individual subject breath holds. Instead, the present disclosure generates 3D image volumes and uses these 3D images volumes to generate the T1 and/or the T2 maps in the particular way claimed. This enables T1 and/or T2 maps to be generated using a 3D high-resolution whole-heart free-breathing sequence. The approach of the present disclosure may be used to generate co-registered T1 and T2 maps. In other words, the present disclosure enables the generation of 3D whole-heart high-resolution joint T1-T2 maps.

The 3D MR acquisition sequence used to acquire the first 3D image may comprise a 3D data acquisition stage preceded by a preparation pulse. The preparation pulse may be an inversion recovery (IR) preparation pulse. The 3D data acquisition stage may occur an inversion time (TI) after the generation of the IR preparation pulse. A motion estimation stage used to acquire an image navigator may occur in the 3D MR acquisition sequence. The motion estimation stage may occur before the data acquisition stage. The motion estimation stage may occur between the preparation pulse and the 3D data acquisition stage. The motion estimation stage may be used to acquire a 2D image navigator.

The 3D MR acquisition sequence used to acquire the second 3D image may comprise a 3D data acquisition stage. The 3D data acquisition stage may not be preceded by a preparation pulse. That is, the 3D MR acquisition sequence used to acquire the second 3D image may not comprise an IR preparation pulse or another preparation pulse such as a T2 preparation pulse. A motion estimation stage used to acquire an image navigator may occur in the 3D MR acquisition sequence. The motion estimation stage may occur before the 3D data acquisition stage. The motion estimation stage may be used to acquire a 2D image navigator.

The 3D MR acquisition sequence used to acquire the third 3D image may comprise a 3D data acquisition stage preceded by a preparation pulse. The preparation pulse may be a T2 preparation pulse. A motion estimation stage used to acquire an image navigator may occur in the 3D MR acquisition sequence. The motion estimation stage may occur before the 3D data acquisition stage. The motion estimation stage may occur between the preparation pulse and the 3D data acquisition stage. The motion estimation stage may be used to acquire a 2D image navigator.

At least one or all of the 3D MR acquisition sequences may use a 3D Cartesian trajectory. The 3D Cartesian trajectory may have spiral profile ordering (also known as CASPR). This may mean that the phase-encoding plane is sampled along approximate spiral interleaves on the Cartesian grid (Kz-Ky). The angular step between two consecutive successive spiral interleaves in the phase-encoding plane may be given by the golden ratio. The Cartesian trajectory may use a variable density (also known as VD-CASPR). This may mean that the sampling density changes along the spiral trajectory, and in particular the centre-region of k-space in the phase-encoding plane is sampled more densely than the outer region of k-space in the phase-encoding plane.

At least one or all of the 3D MR acquisition sequences may be gradient echo sequences.

The 3D MR acquisition sequences may be generated during different cardiac cycles. The 3D MR acquisition sequences may be triggered by a heart-rate sensor such as an electrocardiogram (ECG) sensor. That is, the 3D MR acquisition sequences may be ECG-triggered/gated. The 3D MR acquisition sequences may be generated during successive consecutive cardiac cycles of the subject.

As explained above, at least one or all of the 3D MR acquisition sequences may further comprise a motion estimation stage used to acquire navigator data. The method may further comprise using the acquired navigator data to correct for motion in the data acquired in the 3D data acquisition stage. The motion correction may take place in k-space before the data acquired during the 3D MR acquisition sequences is converted into 3D images. That is, the method may comprise obtaining a k-space dataset for at least one or all of the 3D MR acquisition sequences; performing a motion correction operation on at least one or all of the k-space datasets; and reconstructing at least one or all of the first, second and third 3D images from the motion corrected k-space datasets. The navigator data may provide an estimate for the superior-inferior (SI) and left-right (LR) translational respiratory motion of the subject. These estimates may be used to correct for translational motion in the k-space datasets.

At least one or all of the first, second, and third 3D images may be fat-suppressed 3D images in which the signal contributions of fat tissue are supressed. Fat-suppressed 3D images may also be known as water images. Fat-suppressed 3D images contrast with water-supressed 3D images (also known as fat images) in which the signal contributions of water tissue are supressed.

At least one or all of the first, second, and third 3D images may be fat-supressed 3D images due to the 3D MR acquisition sequences used to obtain these 3D images comprising fat-suppression pulses.

In another example, at least one or all of the first, second, and third 3D images may be fat-supressed 3D images due to the 3D MR acquisition sequences using two point Dixon readouts so as to obtain a pair of echo 3D images. In other words, a dual-echo Dixon imaging technique may be performed. In particular, acquiring at least one or all of the first, second, and third 3D images may comprise: acquiring, during at least one or all of the 3D MR acquisition sequence, a pair of echo 3D images; and using the pair of echo 3D images as an input to a water-fat separation algorithm which generates, as an output, the fat-supressed 3D image.

The pair of echo 3D images may have been acquired with different echo times. A first of the pair of echo 3D images may have been acquired with the fat and water signals in phase at the centre of the echo. This echo 3D image may be referred to as an in-phase image. A second of the pair of echo 3D images may have been acquired with an echo time such that the fat and water signals are out-of-phase. This echo 3D image may be referred to as an out-of-phase image. The pair of echo 3D images may be gradient echo images, i.e. because the 3D MR acquisition sequences may be gradient echo sequences.

The water-fat separation algorithm may compare the pair of echo 3D images so as to determine the fat-supressed 3D image. The water-fat separation algorithm may exploit the chemical shift between the pair of echo 3D images so as to separate the water and fat signals and generate a water image (i.e. a fat-suppressed 3D image) and a fat image (i.e. a water-supressed 3D image). Any existing two-point Dixon technique for determining a water image (i.e. a fat-supressed image) from a pair of echo images.

Due to B0 field inhomogeneity, two ambiguous phase error candidates may be calculated at each voxel. To correct for this, existing two-point Dixon techniques may estimate the B0 map, i.e. so as to correct for the B0 inhomogeneity. The B0 map may be estimated using a phase unwrapping technique.

The method may comprise: during at least one or all of the 3D MR acquisition sequences: reading out a first echo from the subject; reading out a second echo from the subject; using the first echo to generate a first echo 3D image; using the second echo to generate a second echo 3D image; and using the first and second echo 3D images as an input to a water-fat separation algorithm to generate, as an output, a fat-supressed 3D image.

As described above, motion correction may be performed prior to the reconstruction of the 3D images. This may mean that motion correction is performed on the echo readouts (i.e. the k-space data) before the image reconstruction. In other words, the method may comprise: during at least one or all of the 3D MR acquisition sequences: reading out a first echo from the subject; reading out a second echo from the subject; correcting for motion in the first echo readout and the second echo readout using acquired navigator data; using the motion-corrected first echo to generate a first echo 3D image; using the motion-corrected second echo to generate a second echo 3D image; and using the first and second echo 3D images as an input to a water-fat separation algorithm to generate, as an output, a fat-supressed 3D image.

The simulation dictionary may be obtained using extended phase graph (EPG) simulations.

Generating the T1 and/or T2 map comprises generating a joint T1-T2 map of the whole-heart region of the subject.

The acquired 3D images may be bright-blood 3D images. That is, the signals produced by blood are enhanced, and appear bright in the 3D images.

According to a second aspect of the present disclosure, there is provided a computer readable medium having instructions recorded thereon, which, when executed by a computer, cause the computer to perform the method as disclosed above in relation to the first aspect of the disclosure.

According to a third aspect of the present disclosure, there is provided a magnetic resonance, MR, apparatus comprising a computing system, a gradient system, and an excitation system. The gradient system is configured to apply a magnetic field gradient, The excitation system is configured to apply an excitation pulse to the subject and to receive signals from the subject. The computing system is in communication with the excitation system, and the gradient system for controlling these components. The computing system is configured to receive the signals from the excitation system. The computing system is further configured to execute program code to control the gradient system and the excitation system to acquire first, second, and third 3D images of the image volume of the subject, wherein each of the first, second, and third 3D images are acquired at a different time using a 3D MR acquisition sequence with different MR acquisition parameters. The computing system is further configured to determine signal evolutions of the voxels through the first to third 3D images by comparing voxel intensity levels of corresponding voxel locations in the first, second, and third 3D images. The computing system is further configured to obtain a simulation dictionary representing the signal evolutions for a number of different tissue parameter combinations. The computing system is further configured to generate the T1 and/or T2 map by comparing the determined signal evolutions to entries in the dictionary and by finding, for each of the determined signal evolutions, the entry in the dictionary that best matches the determined signal evolution.

The apparatus may be configured to perform the method as described above in relation to the first aspect of the disclosure.

BRIEF DESCRIPTION OF THE DRAWINGS

Examples of the present disclosure will now be described with reference to the accompanying drawings, in which:

FIG. 3 is shows a detailed view of a second of the three 3D MR acquisition sequences shown in FIG. 1;

FIG. 4 is shows a detailed view of a third of the three 3D MR acquisition sequences shown in FIG. 1;

FIG. 5 shows a schematic outlining an example of how the echo images obtained during the three MR acquisition sequences of FIG. 1 are used to generate water images for the three MR acquisition sequences;

FIG. 6 shows a schematic outlining how the obtained water images are used to determine the signal evolutions for the voxels;

FIG. 8 is a process diagram of an example method according to aspects of the present disclosure;

FIG. 9 is a process diagram of a more detailed example method according to aspects of the present disclosure; and FIG. 10 is a simplified schematic diagram of an example MR apparatus according to aspects of the present disclosure.

DETAILED DESCRIPTION

Figure 1:
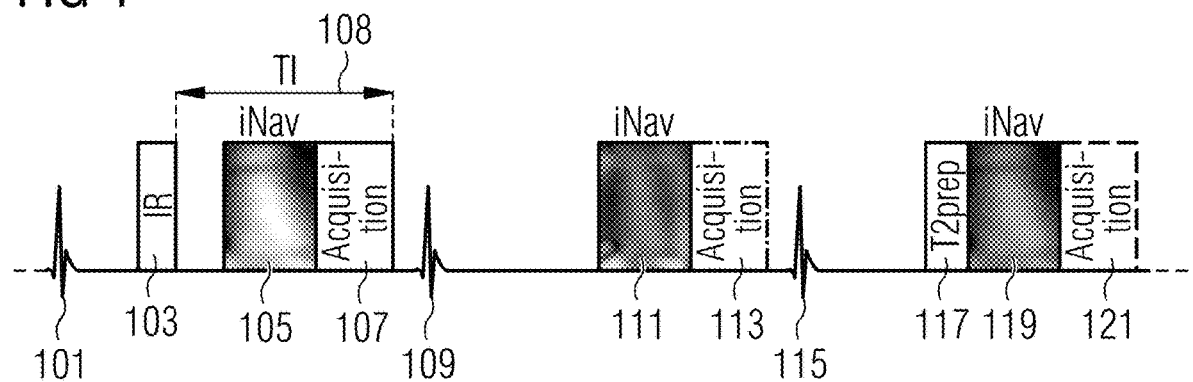
FIG. 1 shows a schematic of an example 3D MR acquisition sequences in accordance with the present disclosure.

Referring to FIG. 1, there is shown a schematic of an MR pulse sequence chart according to aspects of the present disclosure. The MR pulse sequence chart shows example 3D MR acquisition sequences used to acquire first, second, and third 3D images of the image volume of the subject, wherein each of the first, second, and third 3D images are acquired at a different time using a 3D MR acquisition sequence with different MR acquisition parameters. Three 3D MR acquisition sequences are shown occurring during three consecutive cardiac cycles of the subject.

The first cardiac cycle is shown as beginning with ECG pulse 101. The first 3D MR acquisition sequence is ECG-gated, meaning that the generation of the first 3D MR acquisition sequence is triggered by the ECG pulse 101. The first 3D MR acquisition sequence comprises an inversion recovery (IR) pulse 103. A motion estimation sequence 105 is performed following the IR pulse 103 so as to acquire an image navigator (iNav) for the subject. The iNav in this example is a low-resolution 2D iNav. A data acquisition sequence 107 follows the motion estimation sequence 105. The data acquisition sequence 107 is performed an inversion time TI 108 after the generation of the inversion recovery pulse 105. The data acquisition sequence 107 obtains k-space data for the whole-heart region of the subject.

The second cardiac cycle begins with the ECG pulse 109. The second 3D MR acquisition sequence is ECG-gated such that the second 3D MR acquisition sequence is triggered by the ECG pulse 109. The second 3D MR acquisition sequence comprises a motion estimation sequence 111. The motion estimation sequence 111 is performed so as to acquire an iNav for the subject, and in this particular example a low-resolution 2D iNav. A data acquisition sequence 113 follows the motion estimation sequence 111. Unlike the first 3D MR acquisition sequence, the second 3D MR acquisition sequence does not comprise a preparation pulse before the data acquisition sequence 113. This means that the second 3D MR acquisition sequence does not comprise an IR pulse or another preparation pulse such as a T2 preparation pulse (T2 prep). The data acquisition sequence 113 obtains k-space data for the whole-heart region of the subject.

The third cardiac cycle begins with the ECG pulse 115. The third 3D MR acquisition sequence is ECG-gated such that the third 3D MR acquisition sequence is triggered by the ECG pulse 115. The third 3D MR acquisition sequence comprises a T2 preparation pulse (T2prep) 117 followed by a motion estimation sequence 119. The motion estimation sequence 119 is performed so as to acquire an iNav for the subject, and in this particular example a low-resolution 2D iNav. A data acquisition sequence 121 follows the motion estimation sequence 119. The motion estimation sequence 119 is generated shortly after the T2prep pulse 117. The data acquisition sequence 121 is performed shortly after the motion estimation sequence 119. There is no IR pulse following the T2prep pulse 117 in the third imaging sequence. The data acquisition sequence 121 obtains k-space data for the whole-heart region of the subject.

Figure 2:
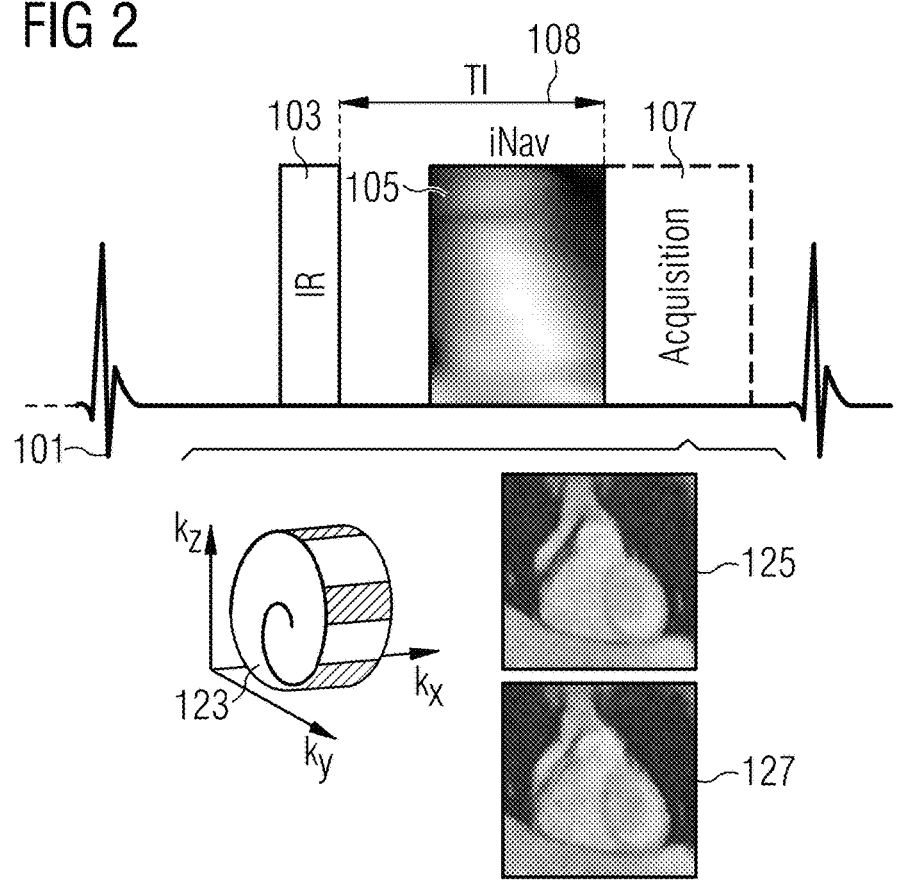
FIG. 2 is shows a detailed view of a first of the three 3D MR acquisition sequences shown in FIG. 1.

Referring to FIG. 2, there is shown a detailed overview of an example first 3D MR acquisition sequence according to aspects of the present disclosure and as shown in FIG. 1. The data acquisition sequence 107 is a 3D gradient echo acquisition sequence that is under-sampled (i.e. accelerated). The acquisition sequence 107 follows a 3D Cartesian trajectory 123 with spiral profile ordering (CASPR). This means that the phase-encoding plane is sampled along approximate spiral interleaves on the Cartesian grid (Kz-Ky). The angular step between two consecutive successive spiral interleaves in the phase-encoding plane is, in this example, given by the golden ratio. The 3D acquisition scheme 123 shown in FIG. 2 also uses a variable-density approach. This means that the sampling density changes along the spiral trajectory, and in particular the centre-region of k-space in the phase-encoding plane is sampled more densely than the outer region of k-space in the phase-encoding plane. This data acquisition sequence 107 is known as 3D Cartesian variable-density (VD-CASPR).

Two echo readouts are performed during the data acquisition sequence 107 so as to obtain two image datasets acquired with different echo times. In other words, a dual-echo Dixon imaging procedure is performed so as to obtain a two-point Dixon read-out. A first of the image datasets may be acquired with the fat and water signals in phase at the centre of the echo. This is known as an in-phase image dataset. The second of the image datasets may be acquired with the echo time (TE) adjusted by a few milliseconds so that the fat and water signals are out-of-phase. This is known as an out-of-phase image dataset. The first and second image datasets which are k-space data are reconstructed to generate 3D MR image volumes 125, 127. The 3D MR image volumes 125, 127 are bright blood image volumes 125, 127. The reconstruction of the MR image volumes 125, 127 from the image datasets is discussed in more detail below.

Referring to FIG. 3, there is shown a detailed overview of an example second 3D MR acquisition sequence according to aspects of the present disclosure and as shown in FIG. 1. The data acquisition sequence 113 is a 3D undersampled gradient echo acquisition sequence. Similar to the data acquisition sequence 107 of FIG. 2, the data acquisitions sequence follows a 3D Cartesian trajectory 129 with spiral profile ordering and variable density sampling (VD-CASPR). Again, two Dixon image readouts are performed during the data acquisition sequence 113 so as to obtain two image datasets acquired with different echo times. The first and second image datasets which are k-space data are reconstructed to generate 3D MR image volumes 131, 133. The 3D MR image volumes 131, 133 are bright blood image volumes 131, 133. The reconstruction of the MR image volumes 131, 133 from the image datasets is discussed in more detail below.

Referring to FIG. 4, there is shown a detailed overview of an example third 3D MR acquisition sequence according to aspects of the present disclosure and as shown in FIG. 1. The data acquisition sequence 121 is a 3D undersampled gradient echo acquisition sequence. Similar to the data acquisition sequence 107 of FIG. 2, the data acquisitions sequence follows a 3D Cartesian trajectory 135 with spiral profile ordering and variable density sampling (VD-CASPR). Again, two Dixon image readouts are performed during the data acquisition sequence 121 so as to obtain two image datasets acquired with different echo times. The first and second image datasets which are k-space data are reconstructed to generate 3D MR image volumes 137, 139. The 3D MR image volumes 137, 139 are bright blood image volumes 131, 133. The reconstruction of the MR image volumes 137, 139 from the image datasets is discussed in more detail below.

In summary, the MR pulse sequence chart shown in FIGS. 1 to 4 results in the generation of three ECG-triggered interleaved 3D bright blood volume datasets. These three interleaved 3D bright blood volume datasets are acquired with data acquisitions sequences 107, 113, 121 that use gradient echo two points Dixon readouts and a variable density Cartesian trajectory with spiral profile order (VD-CASPR). The data acquisition sequences 107, 113, 121 are undersampled (i.e. accelerated). The first dataset is acquired with an IR preparation pulse 103. The second dataset is acquired without preparation pulses, and the third dataset is acquired with a T2prep pulse 117.

Image Reconstruction

The interleaved 3D volume data sets acquired using the first through third 3D MR acquisition sequences are reconstructed so as to generate the MR image volumes 125, 127, 131, 133, 137, and 139 shown in FIGS. 2 through 4.

Prior to the image reconstruction, the acquired 2D image navigators are used to estimate the superior-inferior (SI) and left-right (LR) translational respirator motion of the subject. Translational motion correction is then performed on each echo and each volume is reconstructed independently. This means that data does not need to be rejected due to subject motion, and a 100% scan efficiency can be obtained using a free-breathing sequence.

The motion corrected k-space data for each echo readout is then reconstructed so as to generate the corresponding 3D image 125, 127, 131, 133, 137, and 139.

In general terms, the objective of a reconstruction process is to find an MR image X for which the following inverse problem is minimised:

$$\tilde{X} = \text{argmin} 1/2 \|EX-Y\|2/2$$

Here, X denotes the reconstructed MR image $X \in \mathbb{C}^{M_x \times M_y \times M_z}$.

Here, $\text{argmin}_x f(X)$ is the argument of the minimum operation and finds the value of the variable X at which the function f(X) is minimised.

Here, Y refers to the k-space data, which can be denoted as $Y \in \mathbb{C}^{M_x \times M_y \times M_z \times N_c}$, $M_x$ denotes the number of voxels in the x spatial direction. $M_y$ denotes the number of voxels in the y spatial direction. $M_z$ denotes the number of voxels in the z spatial direction. $N_c$ denotes the number of channels, i.e. the number of receiver coils of the MR apparatus. In practice, the k-space data is undersampled and thus may be defined as $Y \in \mathbb{C}^{Z \times L \times N_c}$, where $Z \ll M_x \times M_y \times M_x$.

Here, E is an encoding operator that transforms the MR images, X, into k-space. E may be defined as being equal to $AFS_c$. A is the undersampling operator that acquires k-space data for the image. F is the Fourier transform operator. $S_c$ is the complex receive-coil sensitivity maps for the $N_c$ channels and may be denoted as $\{S_c\}_{c=1}^{N_c} \in \mathbb{C}^{M_x \times M_y \times M_z \times N_c}$. These coil-sensitivity maps $S_c$ may be determined from MR acquisitions of a fully-sampled k-space centre using a known eigenvalue-based approach commonly referred to as ESPIRIT.

Here, $\|.\|^2/2$ denotes the I2-norm.

The above equation is an inverse problem because it is attempting to determine the source (the MRI images, X, of the image region) from a limited set of observations (the undersampled k-space data, Y of the image region). This inverse problem is generally ill-posed because there may either be several possible solutions (MRI images) to the problem and no way to determine which solution is the correct one. Further, a solution to the inverse problem may not exist at all. Therefore, generally image reconstruction techniques use prior assumptions of the unknown solution, X, when solving the inverse problem.

One example image reconstruction technique that may be used with the present disclosure is parallel imaging. Parallel imaging involves using the known placement and sensitivities of the receiver coils of the MR apparatus to assist in the spatial localization of the MR signal. Parallel imaging techniques process the received signals in parallel along separate channels, one for each receiver coil. This contrasts with non-parallel techniques which first generate a combined signal from the receiver coils before performing the image reconstruction. The parallel imaging techniques consider the relative intensities sensed by the receiver coils and use this information to estimate the location of the tissue corresponding to the sensed signal. The prior information about the receiver coils is therefore exploited for the image reconstruction, which allows for an under-sampled k-space scheme to be used (e.g. by reducing the number of phase encoding steps during image acquisition).

Another example image reconstruction technique that may be used with the present disclosure is compressed sensing. Compressed sensing techniques can involve reconstructing the undersampled k-space data by solving an optimisation problem of the form:

$$\hat{x} = \arg\min_x \left\{ \frac{1}{2} \|Ex - k\|_2^2 + \gamma \Psi_t(x) \right\}$$

x is the reconstructed image series, k is the undersampled k-space data. The encoding operator E=AFS incorporates the sampling matrix A for the k-space data, Fourier transform Fund coil sensitivities S.

$\|.\|^2/2$ denotes the $I_2$-norm defined as $\|u\|^2/2=\sqrt{(\Sigma_i |u_i|^2)}$, for a given vector u defined by vector components $u_i$.

$\Psi_c$ is a 1D temporal total variation (TV) function or a wavelet-based regularization. γ is a regularization parameter.

The component $\frac{1}{2}\|Ex-k\|^2/2$ of the optimisation problem is known as a data consistency component of the compressed sensing procedure.

The component $\Psi_t(x)$ of the optimisation problem is known as a transform sparsity component of the compressed sensing procedure.

The parameter γ is a regularization parameter that determines the trade-off between the data consistency and the sparsity.

Another example image reconstruction technique that may be used with the present disclosure exploits the anatomical similarity within patches of an image and is known as '3D-Patch-based low-rank ReconstructiOn with Self-similariTy learning (3D-PROST)'. 3D-PROST integrates anatomical structure information from 3D patch neighbourhoods through sparse representation, exploiting the redundancy of 3D patches in the acquired data itself. The optimization problem iterates between a data consistency step, which reconstructs a high-resolution isotropic MR volume x, and a low-complexity 3D patch-based denoising step, which provides a reconstructed volume as prior information for the next step. A detailed explanation of the 3D-PROST procedure is disclosed in A. Bustin et al., "Five-minute whole-heart coronary MRA with sub-millimeter isotropic resolution, 100% respiratory scan efficiency, and 3D-PROST reconstruction," *Magn. Reson. Med.*, 2019; 81:102-115, the disclosures of which are hereby incorporated by reference.

Fat Suppression

Referring to FIG. 5, there is shown an overview of a process by which the MR image volumes 125, 127, 131, 133, 137, and 139 for each dataset are input to a water fat separation algorithm indicated by the process blocks 139, 141, 143 so as to generate a water image 145, 147, 149 for each dataset.

In each data set, one of the MR image volumes (e.g. the MR image volume 125 in the first dataset) was acquired when the fat and water signals were in phase at the centre of the echo. The MR image volume 125 can be considered as an in-phase image 125. In simple terms, an in-phase (IP) image can be defined as IP=W+F, where W denotes the signal contributions from water and F denotes the signal contributions from fat. The other of the MR image volumes (e.g. the MR image volume 127 in the first dataset) was acquired when the fat and water signals are out-of-phase. The MR image volume 127 can be considered as an out-of-phase image 127. In simple terms, an out-of-phase (OP) image can be defined as OP=-F, where W denotes the signal contributions from water and F denotes the signal contributions from fat.

In a simple example, a water image (i.e. an image with the signal contributions from fat supressed) can be obtained by performing a pixel-wise addition of the in-phase and out-of-phase images and averaging each of the resultant summed pixel values. Specifically:

$$\frac{1}{2}[IP+OP] = \frac{1}{2}[(W+F)+(W-F)] = \frac{1}{2}2W = W$$

In reality, a simple addition of pixel values does not lead to a reliable estimate of the water image due to effects such as B0 inhomogeneity.

Some existing two-point Dixon techniques explicitly estimate the B0 map by performing phase unwrapping. A particular approach is disclosed in: J. Liu, D. C. Peters, and M. Drangova, "Method of B0 mapping with magnitude-based correction for bipolar two-point Dixon cardiac MRI," *Magn. Reson. Med.*, vol. 78, no. 5, pp. 1862-1869, December 2016., the disclosure of which is hereby incorporated by reference. This approach seeks to improve the reliability of B0 mapping in the water-fat separation algorithm by performing unwrapping error correction. In summary, this approach determines a magnitude-based fat/water mask from the in-phase, out-of-phase image pair (the pair of echo images) and uses this mask as a reference to identify pixels being mismatched by a phase-based mask. The phase-based mask was derived from the B0-corrected phase term of the Hermitian product between in-phase, out-of-phase image pair. Then, the phase error is corrected on a region-by-region basis. Of course, the skilled person will appreciate that other water-fat separation algorithms may be used to generate the water image. In addition to the water image, the water-fat separation algorithm also generates a complementary fat image (water-supressed image) which can also be used to provide useful tissue information regarding the tissue characteristics.

Referring to FIG. 6, there is shown a schematic diagram of another stage of the process in accordance with the present disclosure. In this stage of the process the change in voxel intensity value for each corresponding voxel in the three image datasets is considered so as to obtain the signal evolution.

It will be appreciated that a voxel in the first 3D water image 145 at a voxel location (x1, y1, z1) may have a different signal intensity value to a corresponding voxel located at position (x1, y1, z1) in the second 3D water image 147 due to the difference in the preparation stage of the first and second 3D MR acquisition sequences. This change in signal intensity value from the first 3D water image 145 to the second 3D water image 147 is known as the signal evolution of the voxel. The signal evolutions are between the first 3D water image 145 and the second 3D water image 147 and between the second 3D water image 147 and the third 3D water image 149 are obtained for each of the voxels. It will be appreciated that the voxel values may be normalized in time (i.e. across the three water images 145, 147, 149) before the signal evolutions are determined. That is the signal evolutions may be normalized to the unit norm.

FIG. 6 shows a plot 151 of the acquired signal evolutions. The y-axis denotes the signal intensity values and the x-axis denotes time. The plot 151 shows how the signal intensity values change from the first image volume 145 to the second image volume 147 and from the second image volume 147 to the third image volume 149.

Figure 7:
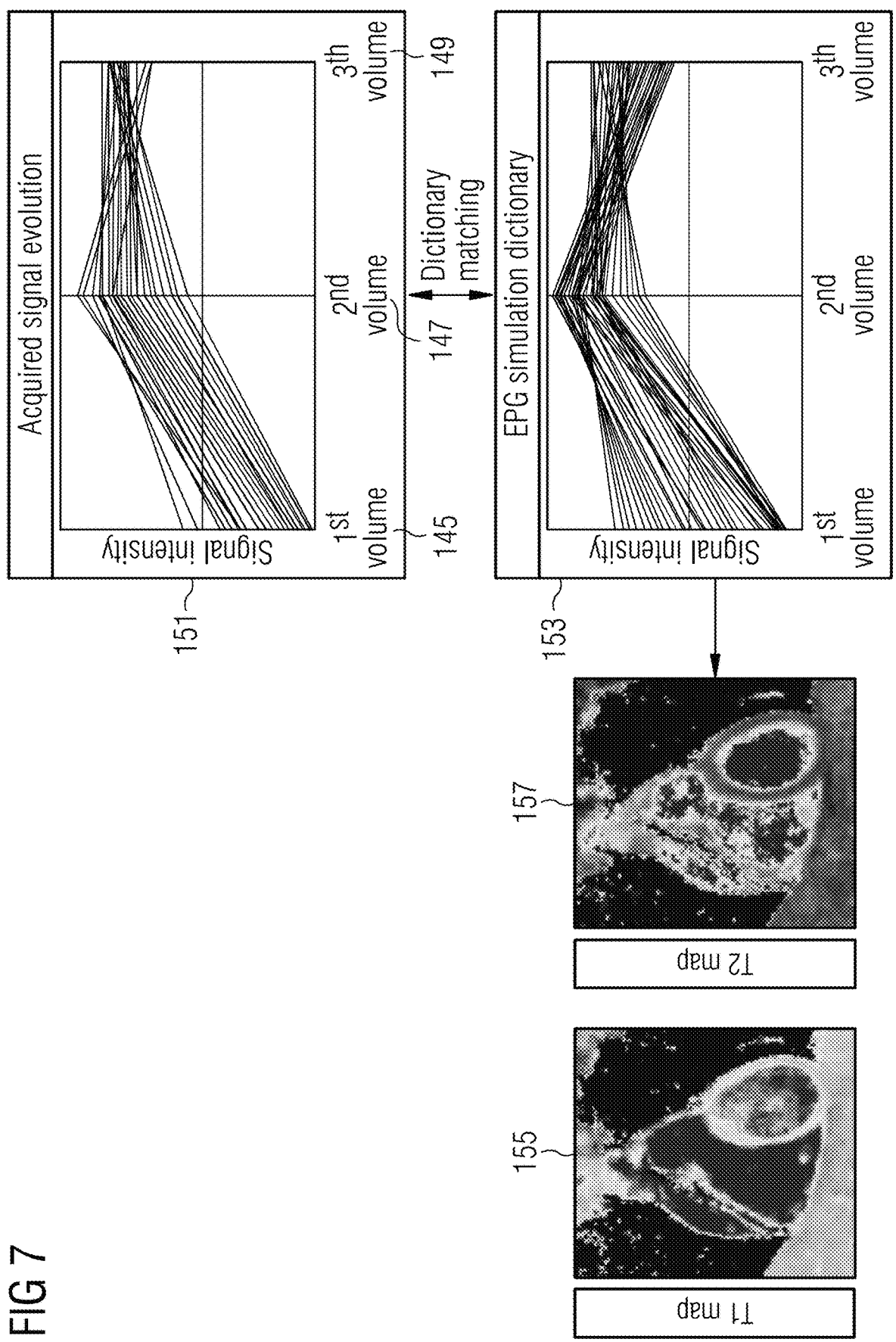
FIG. 7 shows a schematic outlining how the determining signal evolutions are compared with a simulation dictionary so as to generate the T1 and T2 maps.

Referring to FIG. 7, there is shown a schematic diagram of another stage of the process in accordance with the present disclosure. In this stage of the process the determined signal evolutions 151 of the voxels are compared to a simulation dictionary 153 representing the signal evolutions for a number of different tissue parameter combinations. Like the determined signal evolutions, the signal evolutions in the simulation dictionary may be normalized to the unit norm.

The simulation dictionary may be obtained using a computational algorithm that simulates the spin behaviour for a number of different tissue parameters during 3D MR acquisition sequences using the same MR acquisition parameters as used to acquire the 3D images in accordance with the present disclosure. That is the simulations use the same acquisition parameters as the actual parameters of the 3D MR acquisition sequences.

In one example, Bloch equations may be used to generate the simulation dictionary. Bloch equations may be time consuming, so a preferred method in accordance with the present disclosure uses extended phase graph (EPG) simulations to as to obtain the simulation dictionary. EPG simulations work by representing a spin system affected by the sequence as a discrete set of phase states. An existing approach for using EPG simulations is provided in: M. Weigel, "Extended phase graphs: Dephasing, RF pulses, and echoes—pure and simple," J. *Magn. Reson. Imaging*, vol. 41, no. 2, pp. 266-295, February 2015, the discloses of which are hereby incorporated by reference.

Further, the T1 map 155 and the T2 map 157 for the subject are generated by comparing the determined signal evolutions 151 to entries in the dictionary 153 and by finding, for each of the determined signal evolutions, the entry in the dictionary that best matches the determined signal evolution. In other words, a pattern recognition operation is performed to find the dictionary entry that is the best representation of the acquired signal evolution for each voxel.

In one example, the pattern recognition operation takes the inner product between the determined signal evolution and each of the entries in the dictionary. The entry that returns the highest inner product value can then be considered as the dictionary entry that best represents the tissue properties, and the respective T1 and T2 values are then assigned to the voxel.

The matching operation may be accelerated by compressing the dictionary either in the time dimension or in the parameter combinations dimension, thus reducing the total number of comparisons that need to be performed. For example, the singular value decomposition (SVD) can be applied to compress the dictionary in the time dimension and thus reduce the matching time. Another approach to reduce the computational time by matching is to reduce the parameter combination dimension.

For example, dictionary entries that have strong correlations may be grouped together and a new signal that best represents the group may be generated.

Referring to FIG. 8, there is shown an example process diagram for a method according to the first aspect of the present disclosure.

In step 201, the method comprises acquiring first, second, and third 3D images of the image volume of the subject, wherein each of the first, second, and third 3D images are acquired at a different time using a 3D MR acquisition sequence with different MR acquisition parameters.

In step 202, the method comprises determining signal evolutions of the voxels through the first to third 3D images by comparing voxel intensity levels of corresponding voxel locations in the first, second, and third 3D images.

In step 203, the method comprises obtaining a simulation dictionary representing the signal evolutions for a number of different tissue parameter combinations.

In step 204, the method comprises generating the T1 and/or T2 map by comparing the determined signal evolutions to entries in the dictionary and by finding, for each of the determined signal evolutions, the entry in the dictionary that best matches the determined signal evolution.

Referring to FIG. 9, there is shown a detailed overview of a method according to the first aspect of the disclosure which combines the individual steps shown in FIGS. 1 to 7. In this example implementation three ECG-triggered interleaved 3D bright-blood volumes are acquired with gradient echo two points Dixon read out and a variable density Cartesian trajectory with spiral profile ordering (VD-CASPR) 123, 129, 135 and an acceleration factor of greater than 1. In other words, the k-space is undersampled. The acceleration factor used in this particular example is 4.

The first dataset is acquired using an 3D MR acquisition sequence that comprises an IR pulse 103 that precedes a motion estimation sequence 105 used to acquire a 2D image navigator and the 3D data acquisition sequence. The second dataset is acquired using a 3D MR acquisition sequence that comprises a motion estimation sequence 111 and a 3D data acquisition sequence 113 but does not comprise a preceding preparation pulse. The third dataset is acquired using a 3D MR acquisition sequence that comprises a T2 prep pulse 117, followed by a motion estimation sequence 119 and a 3D data acquisition sequence 121. The The 2D image navigators acquired prior to the 3D data acquisition sequences 107, 113, 121 are used to estimate superior-inferior (SI) and left-right (LR) translational respiratory motion. Translation correction is then performed on each echo and each volume is independently reconstructed, preferably by using a 3D patch-based undersampled reconstruction (3D-PROST). The resultant 3D echo images 125, 127, 131, 133, 137, 139 are used as inputs to a water fat separation algorithm so as to generate fat images and water images 145, 147, 149 for each acquired dataset. The 3D motion corrected water images 145, 147, 149 are normalized in time in order to obtain the signal evolution 151, through the three acquired volumes, of each voxel. Extended phase graph (EPG) simulations, matching the acquisition parameters, are carried out to generate a subject-specific simulation dictionary 153. Quantitative T1 and T2 maps 155, 157 are generated by matching each measured signal evolution 151 to a specific dictionary entry 153, corresponding to a unique T1/T2 pair.

Referring to FIG. 10, there is shown an example MR apparatus 400 according the second aspect of the disclosure. The MR apparatus 400 comprises a computing system 401, a gradient system 403, and an excitation system 405.

The gradient system 403 is configured to apply a magnetic field gradient. The gradient system 403 may be configured to apply magnetic field gradients along three spatial axes.

The excitation system 405 may comprise a transmitter (not shown) and a receiver (not shown). The excitation system 405 can be an RF system with one or more RF coils (not shown). The excitation system 405 is configured to apply an excitation pulse to the subject and to receive signals from the subject.

The MR apparatus 400 includes a magnet (not shown) for establishing a stationary magnetic field. The magnet can include a permanent magnet, a superconducting magnet or other type of magnet.

The computing system 401 is in communication with the excitation system 305, and the gradient system 403 for controlling these components. The computing system 401 is configured to receive the signals from the excitation system 405.

The computing system 401 is further configured to execute program code to control the gradient system 403 and the excitation system 405 to acquire first, second, and third 3D images of the image volume of the subject, wherein each of the first, second, and third 3D images are acquired at a different time using a 3D MR acquisition sequence with different MR acquisition parameters. It will be appreciated that the gradient system 403 and the excitation system 405 will acquire k-space datasets that may then be converted into image data by the computing system.

The computing system 401 is further configured to determine signal evolutions of the voxels through the first to third 3D images by comparing voxel intensity levels of corresponding voxel locations in the first, second, and third 3D images. The computing system 401 is further configured to obtain a simulation dictionary representing the signal evolutions for a number of different tissue parameter combinations. The computing system 401 is further configured to generate the T1 and/or T2 map by comparing the determined signal evolutions to entries in the dictionary and by finding, for each of the determined signal evolutions, the entry in the dictionary that best matches the determined signal evolution.

In summary, there is provided a method and apparatus for generating a T1 and/or T2, map for a three-dimensional, 3D, image volume of a subject. The method comprises acquiring first, second, and third 3D images of the image volume of the subject (S201). Signal evolutions of the voxels through the first to third 3D images by comparing voxel intensity levels of corresponding voxel locations in the first, second, and third 3D images (S202). A simulation dictionary representing the signal evolutions for a number of different tissue parameter combinations is obtained (S203). The T1 and/or T2 map is generated by comparing the determined signal evolutions to entries in the dictionary and by finding, for each of the determined signal evolutions, the entry in the dictionary that best matches the determined signal evolution (S204). The method and apparatus can be used to generate high resolution joint T1/T2 maps.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

The invention claimed is:

1. A method of generating a longitudinal magnetic relaxation time constant (T1) or transverse magnetic relaxation time constant (T2) map for a three-dimensional (3D) image volume of a subject, the method comprising:
    applying, by a gradient system, a magnetic field gradient;
    applying, by an excitation system, an excitation pulse to a subject and to receive signals from the subject;
    communicating with and controlling, by a computing system, the excitation system and the gradient system, to receive the signals from the excitation system; and
    executing, by the computing system, program code to control the gradient system and the excitation system to:
        acquire first, second, and third 3D images of the image volume of the subject at different times using a 3D magnetic resonance (MR) acquisition sequence with different MR acquisition parameters, wherein the 3D MR acquisition sequence used to acquire the first 3D image comprises a 3D data acquisition stage preceded by a preparation pulse, and the 3D MR acquisition sequence used to acquire the second 3D image comprises a 3D data acquisition stage which is not preceded by a preparation pulse;
        determine signal evolutions of voxels through the first to third 3D images by comparing voxel intensity levels of corresponding voxel locations in the first, second, and third 3D images;
        obtain a simulation dictionary representing the signal evolutions for a number of different tissue parameter combinations; and
        generate the T1 or T2 map by comparing the determined signal evolutions to entries in the dictionary and by finding, for each of the determined signal evolutions, the entry in the dictionary that best matches the determined signal evolution.

2. A method as claimed in claim 1, wherein the preparation pulse is an inversion recovery preparation pulse.

3. A method as claimed in claim 1, wherein the 3D MR acquisition sequence used to acquire the third 3D image comprises a 3D data acquisition stage preceded by a preparation pulse.

4. A method as claimed in claim 3, wherein the preparation pulse is a T2 preparation pulse.

5. A method as claimed in claim 1, wherein at least one of the 3D MR acquisition sequences uses variable-density Cartesian trajectories with spiral profile ordering.

6. A method as claimed in claim 1, wherein the 3D MR acquisition sequences are generated during successive consecutive cardiac cycles of the subject.

7. A method as claimed in claim 1, wherein at least one of the 3D MR acquisition sequences further comprises a motion estimation stage preceding a 3D data acquisition stage of the 3D MR acquisition sequence, wherein the motion estimation stage is used to acquire navigator data for correcting motion in the data acquired in the 3D data acquisition stage.

8. A method as claimed in claim 1, wherein obtaining at least one of the first, second and third 3D images comprises:
   obtaining a k-space dataset for each 3D MR acquisition sequence;
   performing a motion correction operation on each of the k-space datasets; and
   reconstructing the first, second, and third 3D images from the motion corrected k-space datasets.

9. A method as claimed in claim 1, wherein at least one of the first, second, and third 3D images are fat-suppressed 3D images in which signal contributions of fat tissue are suppressed.

10. A method as claimed in claim 9, wherein acquiring at least one of the first, second, and third 3D images comprises:
    acquiring, during each 3D MR acquisition sequence, a pair of echo 3D images; and
    using the pair of echo 3D images as an input to a water-fat separation algorithm which generates, as an output, the fat-suppressed 3D image.

11. A method as claimed in claim 1, wherein the simulation dictionary is obtained using extended phase graph (EPG) simulations.

12. A non-transitory computer readable medium having instructions recorded thereon, which, when executed by a computer, cause the computer to perform the method of claim 1.

13. A magnetic resonance (MR) apparatus comprising:
    a gradient system configured to apply a magnetic field gradient;
    an excitation system configured to apply an excitation pulse to a subject and to receive signals from the subject; and
    a computing system configured to communicate with and control the excitation system and the gradient system, to receive the signals from the excitation system, and execute program code to control the gradient system and the excitation system to:
       acquire first, second, and third three-dimensional (3D) images of the image volume of the subject at different times using a 3D MR acquisition sequence with different MR acquisition parameters, wherein the 3D MR acquisition sequence used to acquire the first 3D image comprises a 3D data acquisition stage preceded by a preparation pulse, and the 3D MR acquisition sequence used to acquire the second 3D image comprises a 3D data acquisition stage which is not preceded by a preparation pulse;
       determine signal evolutions of voxels through the first to third 3D images by comparing voxel intensity levels of corresponding voxel locations in the first, second, and third 3D images;
       obtain a simulation dictionary representing the signal evolutions for a number of different tissue parameter combinations; and
       generate a T1 or T2 map by comparing the determined signal evolutions to entries in the dictionary and by finding, for each of the determined signal evolutions, the entry in the dictionary that best matches the determined signal evolution.

14. A magnetic resonance (MR) apparatus comprising:
    a gradient system configured to apply a magnetic field gradient;
    an excitation system configured to apply an excitation pulse to a subject and to receive signals from the subject; and
    a computing system configured to communicate with and control the excitation system and the gradient system, to receive the signals from the excitation system, and execute program code to control the gradient system and the excitation system to:
       acquire first, second, and third three-dimensional (3D) images of the image volume of the subject at different times using a 3D MR acquisition sequence with different MR acquisition parameters, wherein at least one of the 3D MR acquisition sequences uses variable-density Cartesian trajectories with spiral profile ordering;
       determine signal evolutions of voxels through the first to third 3D images by comparing voxel intensity levels of corresponding voxel locations in the first, second, and third 3D images;
       obtain a simulation dictionary representing the signal evolutions for a number of different tissue parameter combinations; and
       generate a T1 or T2 map by comparing the determined signal evolutions to entries in the dictionary and by finding, for each of the determined signal evolutions, the entry in the dictionary that best matches the determined signal evolution.

15. A magnetic resonance (MR) apparatus comprising:
    a gradient system configured to apply a magnetic field gradient;
    an excitation system configured to apply an excitation pulse to a subject and to receive signals from the subject; and
    a computing system configured to communicate with and control the excitation system and the gradient system, to receive the signals from the excitation system, and execute program code to control the gradient system and the excitation system to:
       acquire first, second, and third three-dimensional (3D) images of the image volume of the subject at different times using a 3D MR acquisition sequence with different MR acquisition parameters, wherein at least one of the 3D MR acquisition sequences comprises a motion estimation stage preceding a 3D data acquisition stage of the 3D MR acquisition sequence, wherein the motion estimation stage is used to acquire navigator data for correcting motion in the data acquired in the 3D data acquisition stage;
       determine signal evolutions of voxels through the first to third 3D images by comparing voxel intensity levels of corresponding voxel locations in the first, second, and third 3D images;
       obtain a simulation dictionary representing the signal evolutions for a number of different tissue parameter combinations; and
       generate a T1 or T2 map by comparing the determined signal evolutions to entries in the dictionary and by finding, for each of the determined signal evolutions, the entry in the dictionary that best matches the determined signal evolution.

* * * * *